(12) United States Patent
Helm et al.

(10) Patent No.: US 11,635,906 B2
(45) Date of Patent: Apr. 25, 2023

(54) ACCELERATION OF DATA QUERIES IN MEMORY

(71) Applicant: Micron Technology, Inc., Boise, ID (US)

(72) Inventors: Mark A. Helm, Santa Cruz, CA (US); Joseph T. Pawlowski, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 149 days.

(21) Appl. No.: 16/984,429

(22) Filed: Aug. 4, 2020

(65) Prior Publication Data

US 2022/0043593 A1   Feb. 10, 2022

(51) Int. Cl.
*G06F 3/06* (2006.01)
*G11C 11/41* (2006.01)
*G11C 16/04* (2006.01)

(52) U.S. Cl.
CPC .......... *G06F 3/0647* (2013.01); *G06F 3/061* (2013.01); *G06F 3/0604* (2013.01); *G06F 3/0658* (2013.01); *G06F 3/0679* (2013.01); *G06F 3/0688* (2013.01); *G11C 11/41* (2013.01); *G11C 16/0483* (2013.01)

(58) Field of Classification Search
CPC ..... G11C 11/41; G11C 16/0483; G11C 7/065; G11C 7/1039; G11C 7/106; G11C 7/1087; G11C 16/26; G11C 7/1006; G06F 3/0647; G06F 3/0604; G06F 3/061; G06F 3/0658; G06F 3/0679; G06F 3/0688
See application file for complete search history.

(56) References Cited

U.S. PATENT DOCUMENTS

| | | | |
|---|---|---|---|
| 6,618,281 B1 * | 9/2003 | Gordon | G11C 15/00 365/189.07 |
| 7,058,642 B2 | 6/2006 | Kurupati et al. | |
| 8,935,541 B2 * | 1/2015 | Min | G06F 12/1408 713/193 |

(Continued)

OTHER PUBLICATIONS

By Lewin, T.R.; David L.G. Noakes, Theory and Design of Digital Computer System, 2nd Edition. Kluwer Academic Publishers (1992) (Year: 1992).*

(Continued)

*Primary Examiner* — Michael Krofcheck
(74) *Attorney, Agent, or Firm* — Brooks, Cameron & Huebsch, PLLC

(57) ABSTRACT

The present disclosure includes apparatuses and methods for acceleration of data queries in memory. An example apparatus includes an array of memory cells and processing circuitry. The processing circuitry is configured to receive, from a host, a query for particular data in the array of memory cells, wherein the particular data corresponds to a search key generated by the host, search portions of the array of memory cells for the particular data corresponding to the search key generated by the host, search portions of the array of memory cells for the particular data corresponding to the search key, determine data stored in the portions of the array of memory cells that corresponds more closely to the search key than other data stored in the portions of the array of memory cells, and transfer the data that corresponds more closely to the search key than the other data to the host.

27 Claims, 7 Drawing Sheets

(56) References Cited

U.S. PATENT DOCUMENTS

| | | |
|---|---|---|
| 10,261,688 B2* | 4/2019 | Trika ................... G06F 12/02 |
| 10,318,378 B2 | 6/2019 | Hoei et al. |
| 2004/0037152 A1 | 2/2004 | Ooishi |
| 2004/0128441 A1* | 7/2004 | Regev ................... G11C 15/00 |
| | | 711/108 |
| 2008/0189473 A1* | 8/2008 | Murray ............. G06F 12/0246 |
| | | 711/103 |
| 2014/0090081 A1* | 3/2014 | Mattsson ........... G06F 21/6218 |
| | | 726/27 |
| 2014/0136758 A1 | 5/2014 | Sprouse et al. |
| 2019/0171839 A1 | 6/2019 | Rozenberg et al. |
| 2019/0220230 A1 | 7/2019 | Khan et al. |
| 2020/0211640 A1 | 7/2020 | Sharon et al. |

OTHER PUBLICATIONS

International Search Report and Written Opinion from related International Patent Application No. PCT/US2021043370, dated Nov. 16, 2021, 11 pages.

\* cited by examiner

US 11,635,906 B2

ACCELERATION OF DATA QUERIES IN MEMORY

TECHNICAL FIELD

The present disclosure relates generally to semiconductor devices and methods, and more particularly to apparatuses and methods for acceleration of data queries in memory.

BACKGROUND

Memory devices are typically provided as internal, semiconductor, integrated circuits in computers or other electronic systems. There are many different types of memory including volatile and non-volatile memory. Volatile memory may require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory may provide persistent data by retaining stored data when not powered and may include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor may comprise a number of functional units such as arithmetic logic unit (ALU) circuitry, floating point unit (FPU) circuitry, and/or a combinatorial logic block, for example, which may be used to execute instructions by performing an operation on data (e.g., one or more operands). As used herein, an operation may be, for example, a Boolean operation, such as AND, OR, NOT, NAND, NOR, and XOR, and/or other operations (e.g., invert, shift, arithmetic, statistics, among many other possible operations). In many instances, the processing resources may be external to the memory array, and data may be accessed via a bus between the processing resources and the memory array to execute a set of instructions.

DETAILED DESCRIPTION

Figure 1:
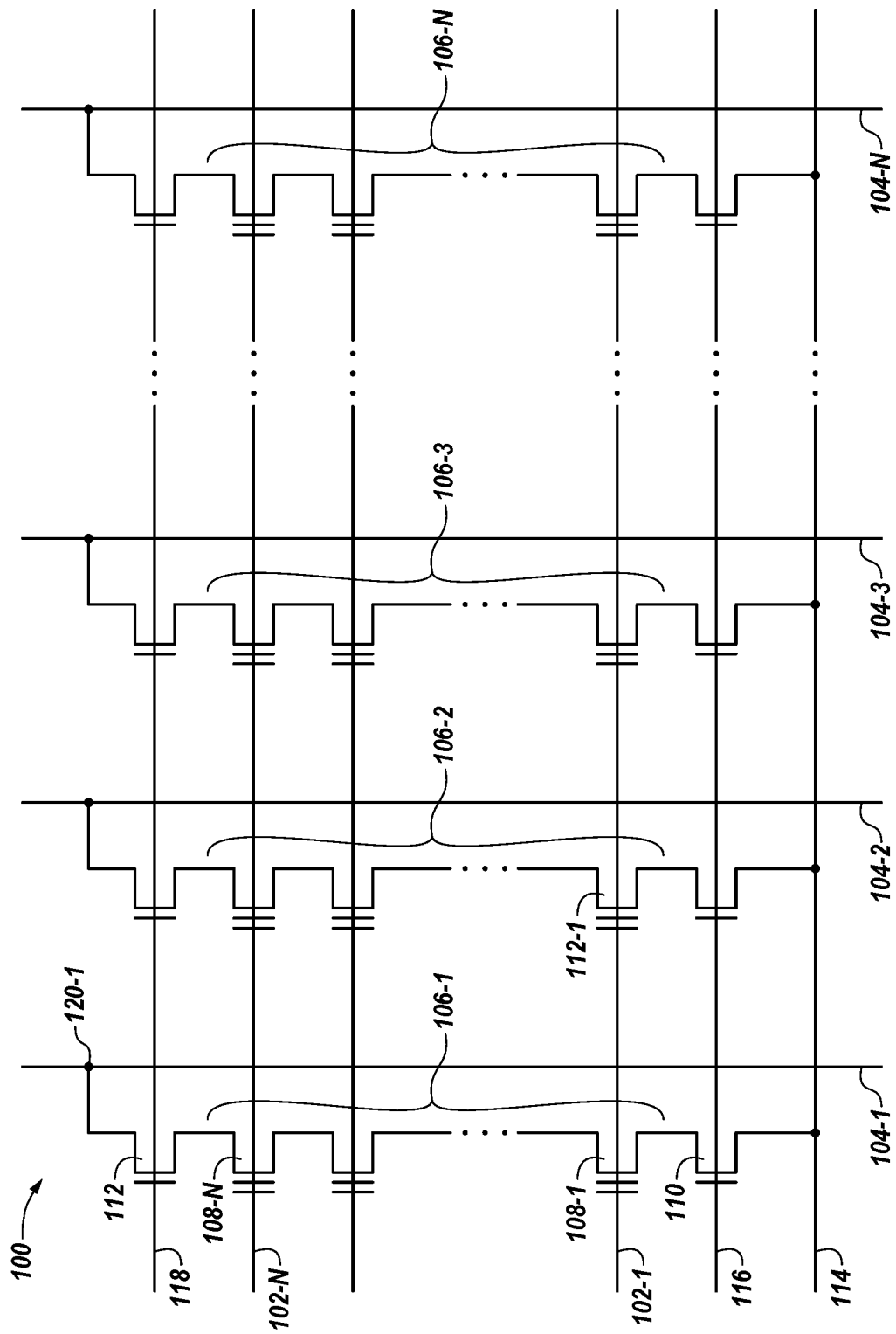
FIG. 1 is a schematic diagram of a portion of a memory array in accordance with a number of embodiments of the present disclosure.

The present disclosure includes apparatuses and methods for acceleration of data queries in memory, such as three-dimensional (3D) memory, as opposed to a separate integrated circuit dedicated to processing, like a CPU, GPU, ASIC, or FPGA. A number of embodiments include an array of memory cells, and processing circuitry configured to receive, from a host, a query for particular data stored in the array of memory cells, wherein the particular data corresponds to a search key generated by the host, and search portions of the array of memory cells for the particular data corresponding to the search key. The processing circuitry is further configured to determine the data stored in the portions of the array of memory cells that corresponds more closely to the search key than other data stored in the portions of the array of memory cells, and transfer the data that corresponds more closely to the search key than the other data to the host.

Memory, such as, for instance, 3D NAND flash memory, may be used as a database in a computing system. In some previous approaches, the coordination of queries (e.g., searches) for data stored in the memory (e.g., in the database) may be controlled by circuitry external to the memory. For example, in some previous approaches, when a user of a host computing device coupled to the memory issues a query for some particular data stored in the memory, data (e.g., pages of data) stored in the memory is transferred from the memory to the host, and the host then processes the received data to identify any data included therein that matches the query (e.g., that satisfies the parameters of the query). For instance, the host may perform operations, such as, for instance, arithmetic operations, on the data to identify the data from the memory that matches the query.

Controlling data queries via circuitry external to the memory in such a manner, however, may be inefficient due to the amount of time (e.g., delay) associated with transferring (e.g., sending) all the data from the memory to the external circuitry (e.g., host) for processing. This delay may be further exacerbated by bandwidth bottlenecks that may occur between the memory and the host.

In contrast, embodiments of the present disclosure may utilize circuitry that is resident on (e.g., physically located on or tightly coupled to) the memory to process a data query issued by the host (e.g., to identify the data stored in the memory that matches the query). For instance, embodiments of the present disclosure may utilize circuitry resident on 3D NAND to perform operations to identify the data that more closely matches the query, such that only the data in the memory that more closely matches the query is sent to the host (e.g., rather than having to send all the data from the memory to the host for processing).

Accordingly, embodiments of the present disclosure may accelerate (e.g., increase the speed of) data queries as compared to previous approaches (e.g., approaches in which the queries are controlled via external circuitry). Additionally, embodiments of the present disclosure may perform the operations of the data query on multiple portions of the data stored in the memory in parallel, which may further accelerate the query.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

As used herein, "a", "an", or "a number of" something may refer to one or more such things, and "a plurality of" something can refer to two or more such things. For example, a number of memory cells may refer to at least one memory cell, and a plurality of memory cells can refer to two or more memory cells.

The figures herein follow a numbering convention in which the first digit or digits correspond to the figure number of the drawing and the remaining digits identify an element or component in the drawing. Similar elements or components between different figures may be identified by the use of similar digits. For example, reference numeral 102 may reference element "02" in FIG. 1, and a similar element may be referenced as 202 in FIG. 2. Multiple analogous elements within one figure may be referenced with a reference numeral followed by a hyphen and another numeral or a letter. For example, 104-1 may reference element 04-1 in FIGS. 1 and 104-2 may reference element 04-2, which may be analogous to element 104-1. Such analogous elements may be generally referenced without the hyphen and extra numeral or letter. For example, elements 104-1 and 104-2 or other analogous elements may be generally referenced as 104.

FIG. 1 is a schematic diagram of a portion of a memory array 100 in accordance with a number of embodiments of the present disclosure. The embodiment of FIG. 1 illustrates a NAND architecture non-volatile memory array, such as, for instance, a portion of a 3D NAND array. However, embodiments described herein are not limited to this example. As shown in FIG. 1, memory array 100 includes access lines 102-1, . . . , 102-N (individually or collectively referred to as access lines 102) and sense lines 104-1, 104-2, 104-3, . . . , 104-N (individually or collectively referred to as sense lines 104). The access lines 102 may also be referred to as conductive lines or word lines. The sense lines 104 may also be referred to as conductive lines, data lines, or bit lines. For ease of addressing in the digital environment, the number of access lines 102 and the number of sense lines 104 may be some power of two (e.g., 256 access lines by 4,096 sense lines).

Memory array 100 may include NAND strings 106-1, 106-2, 106-3, . . . , 106-N (individually or collectively referred to as NAND strings 106). Each NAND string 106 may include non-volatile memory cells 108-1, . . . , 108-N (individually or collectively referred to as memory cells 108), each communicatively coupled to a respective access line 102. Each NAND string 106 (and its constituent memory cells 108) may also be associated with a sense line 104. The non-volatile memory cells 108 of each NAND string 106 may be connected in series between a source select gate (SGS) (e.g., a field-effect transistor (FET)) 110, and a drain select gate (SGD) (e.g., FET) 112. Each source select gate 110 may be configured to selectively couple a respective NAND string 106 to a common source 114 responsive to a signal on source select line 116, while each drain select gate 112 may be configured to selectively couple a respective NAND string 106 to a respective sense line 104 responsive to a signal on drain select line 118.

As shown in the embodiment illustrated in FIG. 1, a source of source select gate 110 may be connected to the common source 114. A drain of source select gate 110 may be connected to memory cell 108-1 of the corresponding NAND string 106-1. The drain of drain select gate 112 may be coupled to sense line 104-1 of the corresponding NAND string 106-1 at drain contact 120-1. The source of drain select gate 112 may be coupled to memory cell 108-N (e.g., a floating-gate transistor) of the corresponding NAND string 106-1.

In a number of embodiments, construction of non-volatile memory cells 108 may include a charge storage structure such as a floating gate, and a control gate. Non-volatile memory cells 108 may couple their control gates to access lines 102. A "column" of the non-volatile memory cells 108 may make up the NAND strings 106 and may be coupled to a given sense line 104. A "row" of the non-volatile memory cells may be those memory cells commonly coupled to a given access line 102. The use of the terms "column" and "row" is not meant to imply a particular linear (e.g., vertical and/or horizontal) orientation of the non-volatile memory cells 108. A NOR array architecture would be similarly laid out, except that the string of memory cells would be coupled in parallel between the select gates.

Subsets of cells coupled to a selected access line (e.g., 102-1, . . . , 102-N) can be programmed and/or sensed (e.g., read) together (e.g., at the same time). A program operation (e.g., a write operation) can include applying a number of program pulses (e.g., 16V-20V) to a selected access line in order to increase the threshold voltage (Vt) of selected cells coupled to that selected access line to a desired program voltage level corresponding to a target (e.g., desired) data state. A sense operation, such as a read or program verify operation, can include sensing a voltage and/or current change of a sense line coupled to a selected cell in order to determine the data state of the selected cell.

Figure 2:
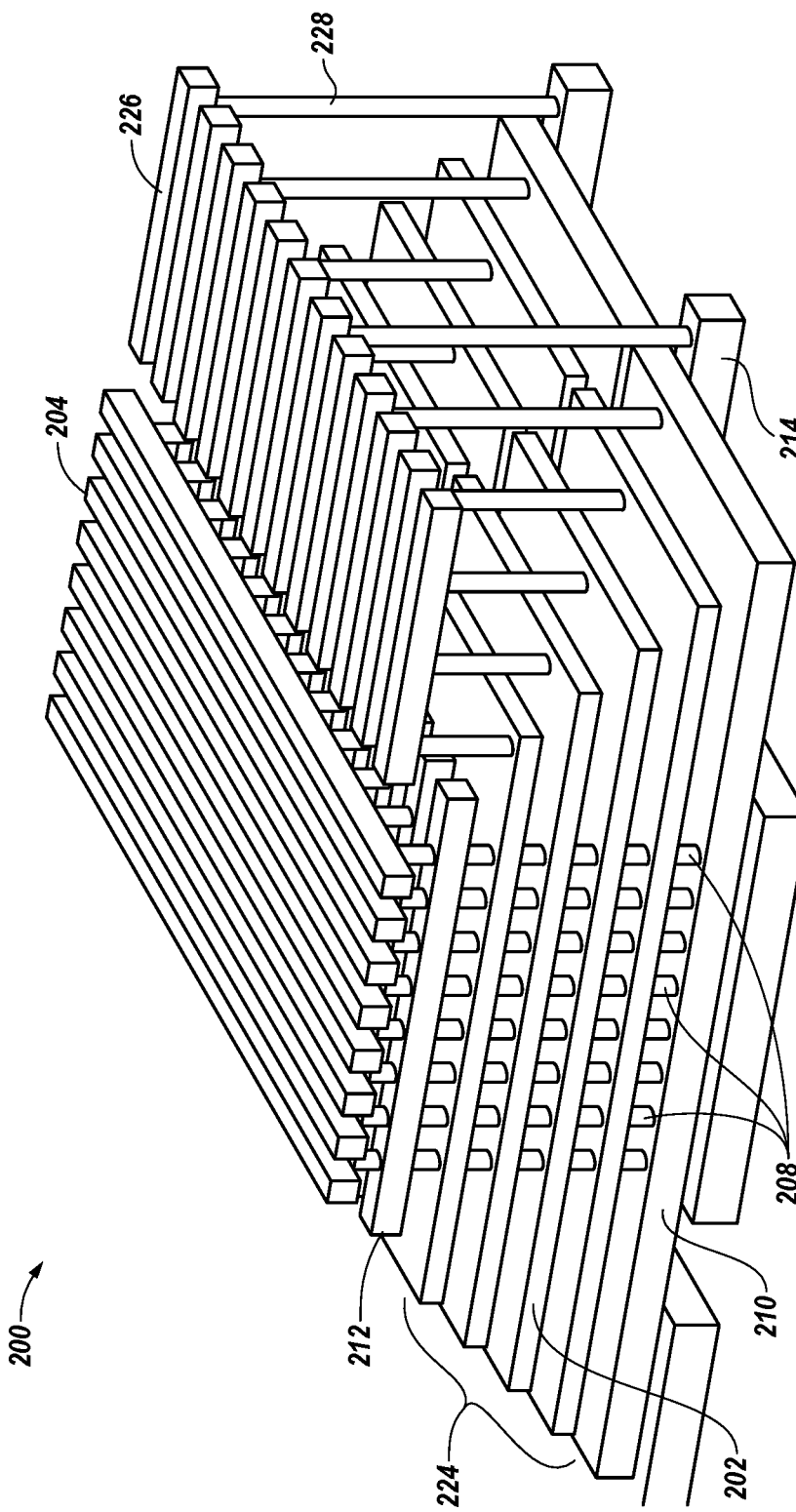
FIG. 2 is a perspective view of a portion of a three-dimensional memory array in accordance with a number of embodiments of the present disclosure.

FIG. 2 is a perspective view of a portion of a three-dimensional memory array 200 in accordance with a number of embodiments of the present disclosure. The memory array 200 may comprise, for example, a NAND flash memory array, such as array 100 previously described in connection with FIG. 1. In some embodiments, memory array 200 may comprise a database. Memory array 200 may include a number of vertical strings of series-coupled memory cells 208 oriented orthogonal to a number of conductive lines, such as access lines 202 and/or sense lines 204.

A plurality of sense lines 204 may be oriented in a first plane, and further oriented in a first direction in the first plane, the vertical strings of series-coupled memory cells 208 being oriented orthogonal to the first plane. A plurality of access lines 202 may be oriented in a second plane, and further oriented in a second direction in the second plane. The access lines 202 may be formed in a planar configuration. The second plane may be substantially parallel to the first plane. The second direction may be perpendicular to the first direction, for example. The sense lines 204 may be shared by a number of vertical strings of series-coupled memory cells 208 in the first direction, and the access lines 202 may be shared by a number of vertical strings of series-coupled memory cells 208 in the second direction.

One or more source lines 214 may be oriented in a third plane, the third plane being substantially parallel to the first and second planes. The source lines 214 may be further oriented in the second direction, for instance, the same direction as the access lines 202 as shown in FIG. 2, or in a different direction. The select gates 212 and 210 may operate to select a particular vertical string of series-coupled memory cells 208 between a sense line 204 and a source line 214. As such, the vertical strings of series-coupled memory devices 208 may be located at the intersections of the sense lines 204 and source line 214.

The access lines 202 may be coupled to (and in some cases form) control gates of memory cells 208 at a particular level and may be used to select a particular one of the series-coupled memory cells 208 within a vertical string. In this manner, a particular memory cell 208 may be selected and electrically coupled to a sense line 204 via operation of the first select gate 212, second select gate 210, and an access line 202. The access lines 202 may be configured to select a memory cell 208 at a particular location within one or more of the vertical strings of series-coupled memory cells 208.

As illustrated in FIG. 2, the planar access lines 202 may be configured to have multiple three-dimensional stair step structures 224 to facilitate vertically-oriented coupling thereto, such as by vertical conductors 228. As such, respective planar access lines 202 may be formed as respective stair steps of the stair step structure 224. A stair step structure 224, as used herein, means a three-dimensional structure having a plurality of stair steps at different elevations extending to different distances in a lateral direction, such as is generally associated with a set of stair steps. According to one embodiment of the present disclosure, the steps of lower elevations may extend laterally beyond the lateral distance that the step at an immediately higher elevation extends, as shown in FIG. 2. For instance, lower steps may extend further in a lateral direction than step(s) above. A lower step may extend laterally a sufficient distance beyond a next higher step so that a vertical coupling may be made to the portion of the lower step extending laterally past the next higher step. In this manner, a vertical conductor 228 may be coupled to the lower step, such as to an access line 202, select gate 212 or 210, or source line 214, which each may correspond to a step in the stair step structure 224. In some embodiments, the vertical conductor 228 may extend down to additional circuitry, such as CMOS under array (e.g. CMOS under array 334 in FIG. 3B) circuitry.

The memory array 200 may be coupled to various circuitry associated with operating the memory array 200. Such circuitry may include string driver circuitry, for instance. As an example, horizontal conductive lines 226 may be routed from the memory array 200, for example, to a string driver. Steps of the stair step structure 224 may be coupled to the conductive lines 226, for instance, via the vertical conductors 228. In this manner, an electrical coupling may be made between the vertical stack of access lines 202, select gates 212 and 210, and/or source lines 214, and the string driver, via the planar horizontal conductive lines 226.

The strings of NAND memory cells (e.g. strings 106 of memory cells in FIG. 1) may be arranged with select gate transistors coupled at each end (e.g., source, drain). Each string may include a number of memory cells 208 coupled in series, drain-to-source. Vertical strings of NAND memory cells may be arranged such that the string of series-coupled memory cells are linearly arranged in a vertical orientation, or may be arranged in non-linear configuration such as in a "U" shape, with portions of the "U" shape being oriented vertically, for example. For instance, the string of series-coupled memory cells may be arranged in a dimension orthogonal to the planes encompassing the access lines (e.g., word lines) and sense lines (e.g., bit lines).

A memory device that includes array 200 may also include processing circuitry, such as CMOS under array circuitry (e.g. circuitry 334 later discussed in FIG. 3B) configured to receive a query, from a host, for data stored in the array 200 of memory cells, and search portions of the array 200 of memory cells for the data. The processing circuitry may also be configured to determine data stored in the portions of the array 200 of memory cells that more closely matches the query than other data stored in the portions of the array of memory cells, and transfer, to the host, only the data that more closely matches the query.

For example, the processing circuitry may be configured to receive a query from a host (e.g. host 554 discussed later in FIG. 5) for particular data stored in array 200 of memory cells. The particular data may correspond to a search key generated by the host. The processing circuitry may be further configured to search portions of the array 200 of memory cells, such as, for instance, different strings of the memory cells, for the particular data corresponding to the search key, and determine data stored in the portions of the array 200 of memory cells that corresponds more closely to the search key than other data stored in the portions of the array 200 of memory cells. Further, the processing circuitry may be configured to transfer the data corresponding more closely to the search key than the other data to the host.

As used herein, the term "query" may refer to a request for data or information from a database or a combination of databases. The query for the particular data stored in array of memory cells 200 may include a query for data corresponding to a number of data fields. The data fields may include a logical block address (LBA) number, an LBA offset, and a count of bits that do not match corresponding bits in a search key. As used herein, the term "bit" may refer to a portion of data that can be stored in a memory cell. As used herein, the term "search key" may refer to an attribute or a set of attributes that are used to access a database record. The particular data may correspond to the search key. In some examples, the host may generate the search key. As used herein, the term "more closely" may refer to a threshold number of bits in the particular data being the same as the corresponding bits in the search key. For instance, a portion of data may correspond more closely to the search key than other data if the portion of data includes more bits that match corresponding bits in the search key than the other data, and/or if the number of bits in the portion of data that match the corresponding bits in the search key exceeds the threshold number of bits.

In some embodiments, the processing circuitry may be configured to store the data that corresponds more closely to the search key in a separate memory device. The number of portions of the array 200 of memory cells whose data may be stored in the separate memory device may correspond to an amount of data included in each of the data fields. In some embodiments, the separate memory device may be a static random-access memory (SRAM) device. In some embodiments, the amount of data included in each of the data fields may be defined by the host.

The processing circuitry may be configured to determine the data that corresponds more closely to the search key based on an amount of current conducted by the portions of the array 200 of memory cells (e.g., by each different memory cell string) when current is applied to that portion. In some embodiments, the amount of current conducted by a portion of the array 200 of memory cells may increase when more memory cells in that portion store data corresponding to the bits in the search key. Alternatively, the amount of current conducted by a portion of the array 200 of memory cells may decrease when less memory cells in that portion store data corresponding to the bits in the search key. In some embodiments, the data stored in the portions of the array 200 of memory cells that conduct more current are determined to correspond more closely to the search key than the other data stored in the portions of the array 200 of memory cells. Alternatively, the data stored in the portions of the array of memory cells that conduct less current are determined to correspond less closely to the search key than the other data stored in the portions of the array 200 of memory cells. This may occur because a memory cell in the portion of the array 200 of memory cells may conduct current if its data matches a corresponding bit in the search key. Memory cells that store data that does not match a corresponding bit in the search key may not conduct as much current as memory cells that store data that does match a corresponding bit in the search key.

Figure 3A:
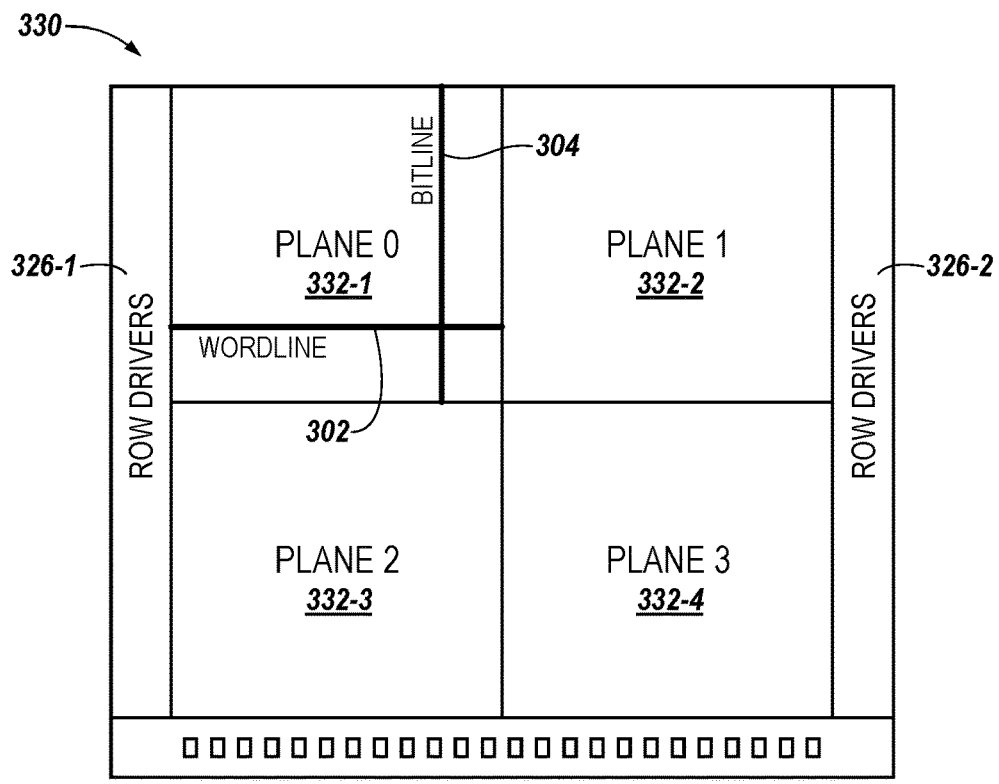
FIGS. 3A-3B are top-down views of different levels of a three-dimensional memory array in accordance with a number of embodiments of the present disclosure.
Figure 3B:
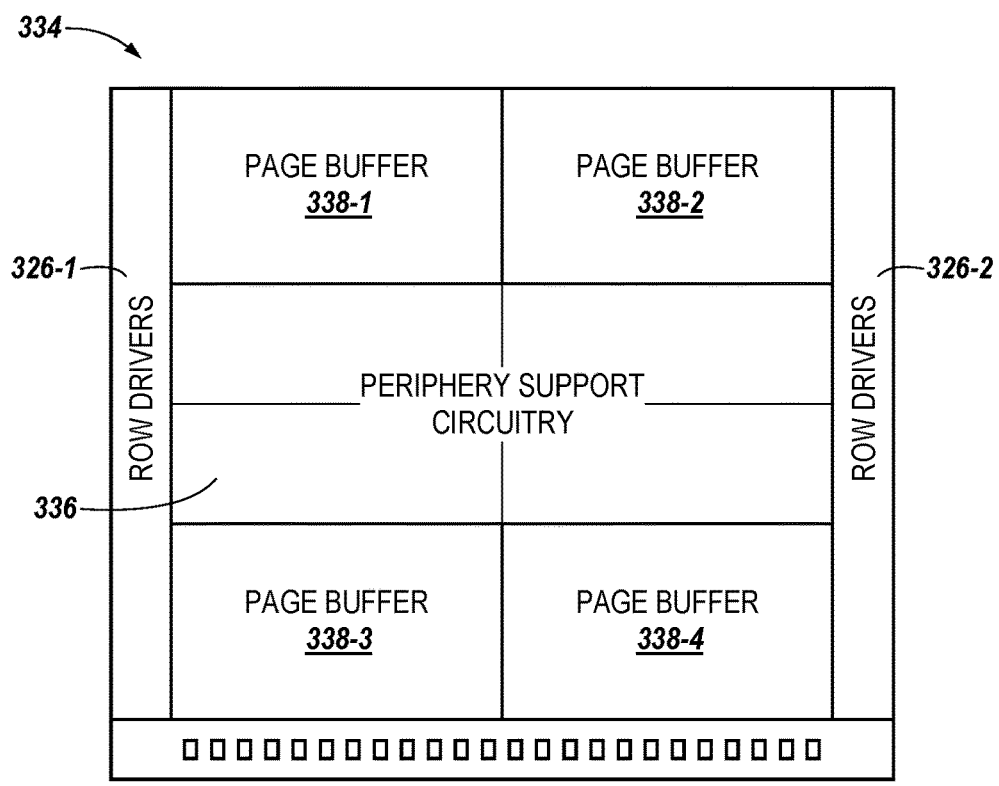

FIGS. 3A-3B are top-down views of different levels of a (e.g., within) 3D memory array such as, for instance, array 200 of FIG. 2, in accordance with a number of embodiments of the present disclosure. Other components included in a level of the 3D memory array may be omitted for ease of illustration.

FIG. 3A illustrates a level 330 of a 3D memory array. The level 330 of the 3D memory array may be one of the steps of the stair step structure of the array (e.g. stair step structure 224 of FIG. 2). The level 330 may be segmented into multiple planes. For example, the level 330 may include a first plane (e.g. plane 0) 332-1, a second plane (e.g. plane 1) 332-2, a third plane (e.g. plane 2) 332-3, and a fourth plane (e.g. plane 3) 332-4 (individually or collectively referred to as planes 332). As illustrated, the first plane 332-1 may include a sense line 304 and an access line 302. Although not shown in FIG. 3A, the second plane 332-2, the third plane 332-3, and the fourth plane 332-4 may also include access lines and sense lines. The level 330 may also include conductive lines (e.g. row drivers) 326-1 and 326-2 (individually or collectively referred to as conductive line 326). In some embodiments, the row drivers 326 may be contiguous to the planes 332.

FIG. 3B illustrates another level 334 of a 3D memory array. In some embodiments, the level 334 may be under the stair step structure of the 3D memory array. For example, the level 334 may be a complementary metal oxide semiconductor (CMOS) under array structure. As used herein, the term "CMOS under array" may refer to logic circuitry for a memory array that is formed below the memory array. The level 334 (e.g., the circuitry of level 334) may be segmented into first page buffer 338-1 that corresponds to plane 0, a second page buffer 338-2 that corresponds to plane 1, a third page buffer 338-3 that corresponds to plane 2, a fourth page buffer 338-4 that corresponds to plane 3, and periphery support circuitry 336. The level 334 may also include conductive lines (e.g. row drivers) 326-1 and 326-2 that are contiguous to the page buffers 338 and the periphery support 336.

Figure 4:
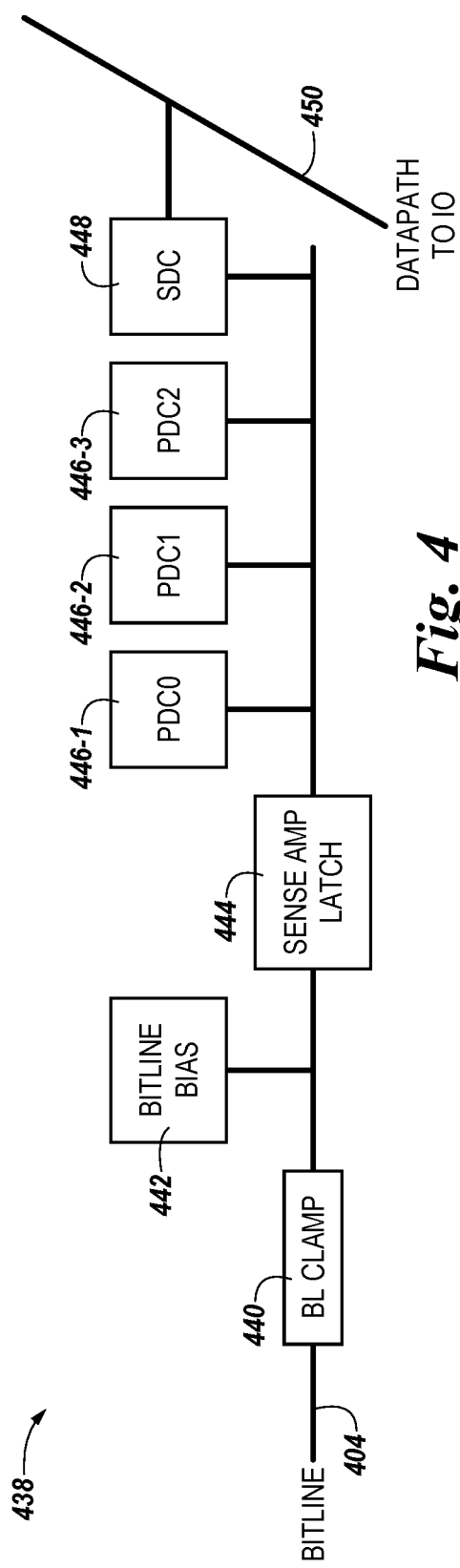
FIG. 4 is a block diagram of circuitry for the acceleration of data queries in memory in accordance with a number of embodiments of the present invention.

FIG. 4 is a block diagram of circuitry 438 for the acceleration of data queries in memory in accordance with a number of embodiments of the present invention. Circuitry 438 can be, for instance, a page buffer that is included in level 334 previously described in connection with FIG. 3B.

The circuitry 438 may include a sense line 404 that includes a sense line clamp 440, sense line bias circuitry 442, a sense amplifier (amp) latch 444, primary data caches 446-1, 446-2, and 446-3 (individually or collectively referred to as primary data caches 446), a secondary data cache 448, and an input/output (I/O) bus 450.

The sense line 404 may allow current to travel through the memory array. For instance, current can be provided to the string of memory cells coupled to sense line 404 by applying a current to sense line 404. The sense line clamp 440 may comprise a number of transistors that limit the amount of voltage that is applied across the sense line 404. By limiting the amount of voltage that is applied across the sense line 404, the sense line clamp 440 may protect the electrical components of the memory from receiving voltages that are larger than the intended voltages for the electrical components.

The sense line 404 may include sense line bias circuitry 442. As used herein, the term "sense line bias circuitry" may refer to an electrical component that applies a current to the sense line 404 to keep a voltage across the sense line 404 in a certain range. The sense line bias circuitry 442 may work alongside the sense line clamp 440 to provide the intended level of voltage to the other electrical components on the sense line 404.

The sense line 404 may also include a sense amp latch 444. The sense amp latch 444 may be a part of read circuitry that is used to read data stored in a memory cell. By using circuitry including a sense amp latch 444 to read the data on a memory cell, the data on the memory cell may be compared to the search key to determine if the data on the memory cell is the same as a corresponding bit in the search key, as described herein.

The sense line 404 may include the primary data caches 446 and a secondary data cache 448. The primary data caches 446 may store frequently requested data and instructions so they are immediately available to the central processing unit (CPU). In some embodiments, the primary data caches 446 may be used as intermediate data storage for read operation algorithms and program algorithms. The secondary data cache 448 may be used for sending data to the I/O bus 450 and receiving data from the I/O bus. In some embodiments, the I/O bus 450 may couple to a host (e.g. host 554 in FIG. 5) and exchange data between the host and a memory device.

The circuitry 438 may receive a request from a host and transfer data that more closely matches a search key of the request than other data as described in reference to FIGS. 1-3 and 5. By configuring the circuitry 438 to perform the functions as described herein, the circuitry may accelerate the speed of data queries in the 3D memory array. The circuitry 438 may be configured to perform functions, such as comparing portions of data to a search key and determining the data that more closely matches the search key, that may have been performed by a host in previous approaches. This may allow the query to be performed faster than previous approaches by performing these functions in the memory device instead of transferring the data out of the memory device to perform the functions. This may increase the speed of the functions because it may reduce (e.g. eliminate) the time lag in performing the function caused by transferring the data out of the memory device before performing the functions.

Figure 5:
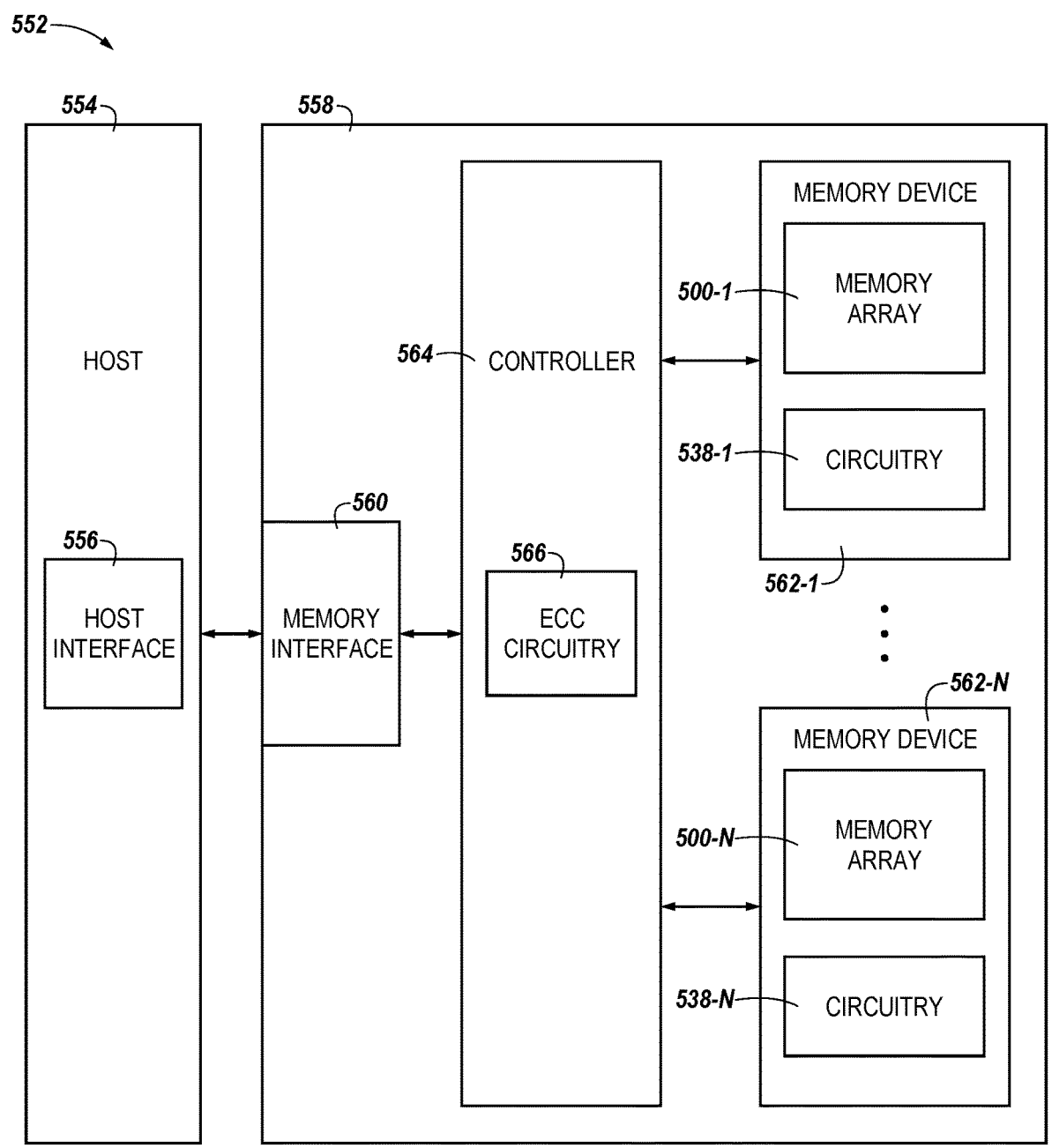
FIG. 5 is a functional block diagram of a computing system for acceleration of data queries in memory in accordance with a number of embodiments of the present disclosure.

FIG. 5 is a functional block diagram of a computing system 552 for the acceleration of data queries in memory in accordance with a number of embodiments of the present disclosure. In the embodiment illustrated in FIG. 5, computing system 552 includes a host 554 and a memory system 558. Memory system 558 may include a memory interface 560, a number of memory devices 562-1, . . . , 562-N (individually or collectively referred to as memory devices 562), and a controller 564 coupled to the memory interface 560 and memory devices 562. Memory interface 560 may be used to communicate information between memory system 558 and another device, such as a host 554. Host 554 may include a processor (not shown). As used herein, "a processor" may be a number of processors, such as a parallel processing system, a number of coprocessors, etc. Example hosts may include, or be implemented in, laptop computers, personal computers, digital cameras, digital recording devices and playback devices, mobile telephones, PDAs, memory card readers, interface hubs, and the like.

In a number of embodiments, host 554 may be associated with (e.g., include or be coupled to) a host interface 556. The host interface 556 may enable an input of scaled preferences (e.g., in numerically and/or structurally defined gradients) to define, for example, critical dimensions (CDs) of a final structure or intermediary structures of a memory device (e.g., as shown at 562) and/or an array of memory cells (e.g., as shown at 500) formed thereon to be implemented by a processing apparatus (not shown). The array may include access devices having semiconductor structures, access lines, and dielectric material formed according to embodiments described herein. The scaled preferences may be provided to the host interface 556 via input of a number of preferences stored by the host 554, input of preferences from another storage system (not shown), and/or input of preferences by a user (e.g., a human operator).

Memory interface 560 may be in the form of a standardized physical interface. For example, when memory system 558 is used for information (e.g., data) storage in computing system 552, memory interface 560 may be a serial advanced technology attachment (SATA) interface, a peripheral component interconnect express (PCIe) interface, or a universal serial bus (USB) interface, among other physical connectors and/or interfaces. In general, however, memory interface 560 may provide an interface for passing control, address, information, scaled preferences, and/or other signals between the controller 564 of memory system 558 and a host 554 (e.g., via host interface 556).

Controller 564 may include, for example, firmware and/or control circuitry (e.g., hardware). Controller 564 may be operably coupled to and/or included on the same physical device (e.g., a die) as one or more of the memory devices 562-1, . . . , 562-N. For example, controller 564 may be, or may include, an ASIC as hardware operably coupled to circuitry (e.g., a printed circuit board) including memory interface 560 and memory devices 562. Alternatively, controller 564 may be included on a separate physical device that is communicatively coupled to the physical device (e.g., the die) that includes one or more of the memory devices 562.

Controller 564 may communicate with memory devices 562 to direct operations to sense (e.g., read), program (e.g., write), and/or erase information, among other functions and/or operations for management of memory cells. Controller 564 may have circuitry that may include a number of integrated circuits and/or discrete components. In a number of embodiments, the circuitry in controller 564 may include control circuitry for controlling access across memory devices 562 and/or circuitry for providing a translation level between host 554 and memory system 558.

Memory devices 562 may include, for example, a number of memory arrays 500 (e.g., arrays of memory cells). Arrays 500 can be, for instance, 3D NAND arrays analogous to memory array 200 described in connection with FIG. 2.

Memory devices 562 may be formed on the same die. A memory device (e.g., memory device 562-1) may include one or more arrays of memory cells formed on the die. A memory device may include circuitry 538 associated with the one or more arrays formed on the die, or portions thereof. In some embodiments, the circuitry 538 may be utilized to determine (sense) a particular data value (e.g., 0 or 1) that is stored at a particular memory cell in a row of a memory array 522. In some embodiments, the circuitry 538 may be utilized to sense particular data values, in addition to directing storage, erasure, etc., of data values in response to a command from host 554 and/or host interface 556. The command may be sent directly to the circuitry 538 via the memory interface 560 or to the circuitry 538 via the controller 564.

The embodiment illustrated in FIG. 5 may include additional circuitry that is not illustrated so as not to obscure embodiments of the present disclosure. For example, memory devices 562 may include address circuitry to latch address signals provided over I/O connectors through I/O circuitry. Address signals may be received and decoded by a row decoder and a column decoder to access a memory array 500. It will be appreciated that the number of address input connectors may depend on the density and/or architecture of memory devices 562 and/or memory arrays 500.

The circuitry 538 may be configured to receive, from a host 554, a query for data stored in the array 500 of memory cells and search portions of the array 500 of memory cells for the data. The circuitry 538 may also be configured to determine the data stored in the portions of the array 500 of memory cells that more closely matches the query than other data stored in the portions of the array 500 of memory cells and transfer only the data that more closely matches the query than the other data to the host 554.

The host 554 may be configured to send a query to the memory device 562 for particular data stored in the memory device and generate a search key to denote the particular data. The query may include a command to search for the particular data in the memory device 562. In some embodiments, the particular data denoted in the search key may be encrypted. The data may be encrypted by controller 564. The data stored in portions of the memory device 562 may also be encrypted. The data may be encrypted by controller 564. The NAND device 562 may only recognize the data in its encrypted form. In these embodiments, the query may request the data in its encrypted form. In other embodiments, the particular data denoted by the search key and the data stored in portions of the memory device 562 may be unencrypted. The host 554 may be configured to decrypt the data stored in the host 554 and the memory device 562.

In response to receiving the query from the host 554, memory device 562 may be configured to search portions of the memory device 562 for the particular data and count a number of bits in each portion of the memory device 562 that do not match the particular data denoted by the search key. This count may be performed to determine data stored in the portions of the memory device 562 that more closely matches the query than other data stored in the portions of the memory devices. The memory device 562 may be further configured to transfer the data that more closely matches the query than the other data to the host 554. The host 554 may be configured to determine which portions of the array of memory cells 500 more closely match the query by comparing the data sent to the host 554 to the search key.

A controller 564, may include error correction circuitry (ECC) 566 configured to correct errors in the data that more closely matches the query. Memory devices 562 (e.g., NAND devices) may have errors randomly distributed amongst the data the NAND device 562 is storing. The errors in the data that more closely matches the query may be corrected by the ECC circuitry 566 on controller 564 upon reading the data and before the data is sent to the host 554. The memory device 562 may not correct errors and, therefore, may need to communicate with the controller chip to correct the errors in the data. The error correction code used by the ECC circuitry to correct the data may be sent to the host 554 along with the data.

The host 554 may set parameters for the amount of bits in the particular data that do not match the corresponding bits in the search key that would result in the data not being sent to the host 554. In some embodiments, the host 554 may set a minimum mismatch bit count for the query. In some embodiments, the host 554, may also set a maximum mismatch bit count for the query. If the amount of bits in the particular data that do not match a corresponding bit in the search key is greater than the maximum mismatch bit count for the query or lower than the minimum mismatch bit count for the query, the particular data may not be sent to the host.

Groups of memory cells in the memory array 500 may be pages of memory cells. A typical page of a NAND device may be sixteen kilobytes (KB). The memory array 500 may search an entire page of memory cells in parallel.

Figure 6:
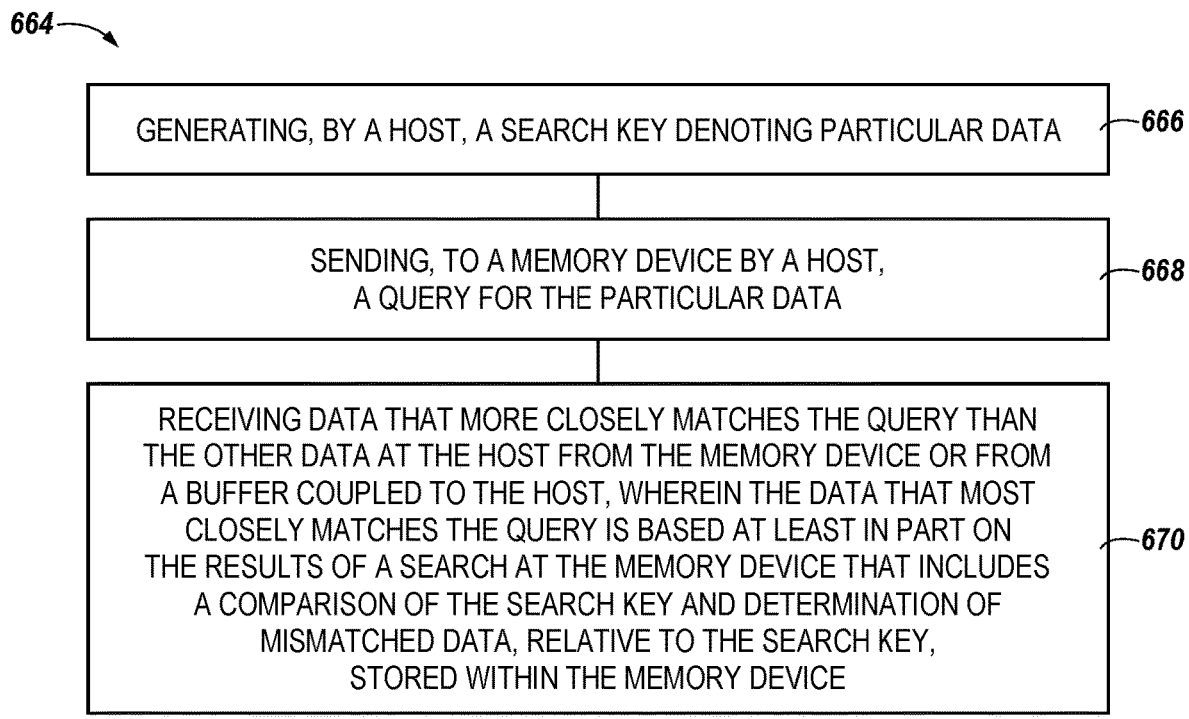
FIG. 6 is a flow diagram of an example method for acceleration of data queries in memory in accordance with a number of embodiments of the present disclosure.

FIG. 6 is a flow diagram of an example method 664 for acceleration of data queries in memory in accordance with a number of embodiments of the present disclosure. The method 664 may be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. Although shown in a particular sequence or order, unless otherwise specified, the order of the processes may be modified. Thus, illustrated embodiments should be understood only as examples, and the illustrated processes may be performed in a different order, and some processes may be performed in parallel. Additionally, not all processes are required in every embodiment. Other process flows are possible.

At block 666, the method 664 includes generating, by a host, a search key denoting particular data. As stated above, particular data requested by a query from the host may correspond to the search key. The host may set minimum and maximum mismatch bit counts for the query.

At block 668, the method 664 includes sending, to a memory device by the host, a query for the particular data. The query may be a request for particular data stored in a memory array of a memory device. In some embodiments, the particular data may be unencrypted.

At block 670, the method 664 includes receiving data that more closely matches the query than the other data at the host from the memory device or from a buffer coupled to the host, wherein the data that most closely matches the query is based at least in part on the results of a search at the memory device that includes a comparison of the search key and determination of mismatched data, relative to the search key, stored within the memory device. In some embodiments, the particular data is received based at least in part on an amount of bits in the particular data that do not match a corresponding bit in the search key being greater than a maximum mismatch bit count for the query.

Figure 7:
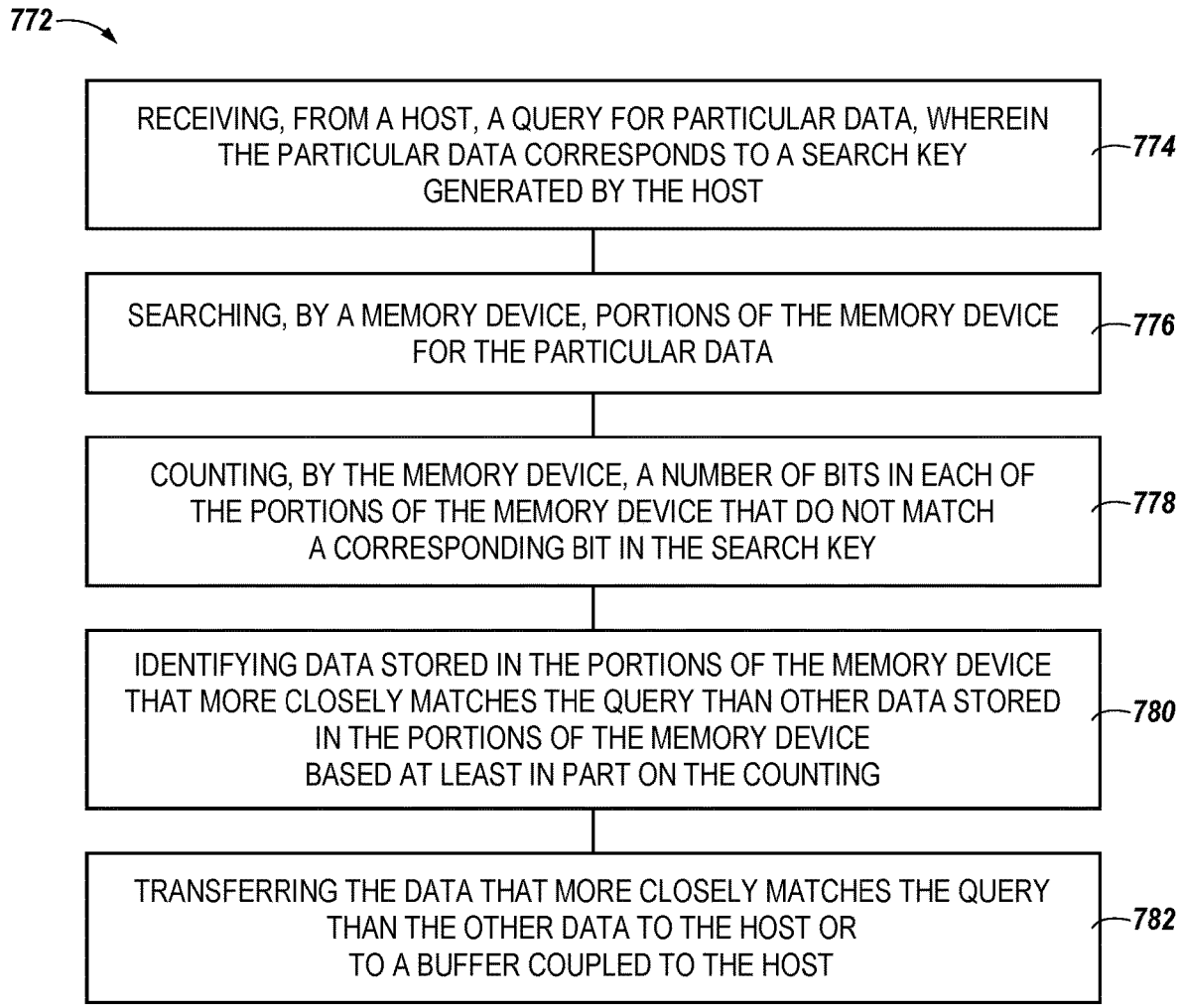
FIG. 7 is another flow diagram of an example method for acceleration of data queries in memory in accordance with a number of embodiments of the present disclosure.

FIG. 7 is another flow diagram of an example method 772 for acceleration of data queries in memory in accordance with a number of embodiments of the present disclosure. The method 772 may be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. Although shown in a particular sequence or order, unless otherwise specified, the order of the processes may be modified. Thus, illustrated embodiments should be understood only as examples, and the illustrated processes may be performed in a different order, and some processes may be performed in parallel. Additionally, not all processes are required in every embodiment. Other process flows are possible.

At block 774, the method 772 includes receiving, from a host, a query for particular data, wherein the particular data corresponds to a search key generated by the host. At block 776, method 772 includes searching, by a memory device, portions of the memory device for the particular data. In some embodiments, the portions of the memory device are pages of memory cells. In some embodiments, the memory device may search an entire page of memory cells in parallel.

At block 778, the method 772 includes counting, by the memory device, a number of bits in each of the portions of the memory device that do not match a corresponding bit in the search key. At block 780, the method 772 includes identifying data stored in the portions of the memory device that more closely matches the query than other data stored in the portions of the memory device based at least in part on the counting. In some embodiments, data stored in the memory device has a lesser number of mismatch bits corresponding to bits in the search key than other data stored in the memory device. In some embodiments, the data with the lesser number of mismatch bits may be seen as more closely matching the query.

At block 782, the method 772, includes transferring the data that more closely matches the query than the other data to the host or to a buffer coupled to the host. In some embodiments, the memory device may prioritize sending some data before sending other data. For example, amongst the portions of data that more closely match the query, the portions of data that include a lesser number of mismatch bits than other portions of data that more closely match the query may be sent to the host before the other portions of data that more closely match the query.

In the above detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

It is to be understood that the terminology used herein is for the purpose of describing particular embodiments only and is not intended to be limiting. As used herein, the singular forms "a", "an", and "the" include singular and plural referents, unless the context clearly dictates otherwise, as do "a number of", "at least one", and "one or more" (e.g., a number of memory arrays may refer to one or more memory arrays), whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically and, unless stated otherwise, can include a wireless connection for access to and/or for movement (transmission) of instructions (e.g., control signals, address signals, etc.) and data, as appropriate to the context.

Although specific embodiments have been illustrated and described herein, those of ordinary skill in the art will appreciate that an arrangement calculated to achieve the same results may be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   an array of memory cells; and
   processing circuitry configured to:
   receive, from a host, a query for particular data stored in the array of memory cells, wherein the particular data corresponds to a search key generated by the host, and wherein the host sets a maximum mismatch bit count and a minimum mismatch bit count for the query;
   search portions of the array of memory cells for the particular data corresponding to the search key;
   determine data stored in the portions of the array of memory cells that includes more bits that match corresponding bits in the search key than other data stored in the portions of the array of memory cells; and
   transfer the data that includes more bits that match the corresponding bits in the search key than other data to the host, wherein the data that includes more bits that match the corresponding bits in the search key than the other data is not transferred to the host when an amount of bits in that data that do not match a corresponding bit in the search key is greater than the maximum mismatch bit count or less than the minimum mismatch bit count.

2. The apparatus of claim 1, wherein the processing circuitry is configured to determine the data that includes more bits that match the corresponding bits in the search key based on an amount of current conducted by the portions of the array of memory cells.

3. The apparatus of claim 2, wherein the amount of current conducted by a portion of the array of memory cells increases when more memory cells in that portion store data corresponding to bits in the search key.

4. The apparatus of claim 2, wherein the amount of current conducted by a portion of the array of memory cells decreases when less memory cells in that portion store data corresponding to bits in the search key.

5. The apparatus of claim 2, wherein the data stored in the portions of the array of memory cells that conduct more current are determined to include more bits that match the corresponding bits in the search key than the other data stored in the portions of the array of memory cells.

6. The apparatus of claim 2, wherein the data stored in the portions of the array of memory cells that conduct less current are determined to include less bits that match the corresponding bits in the search key than the other data stored in the portions of the array of memory cells.

7. The apparatus of claim 1, wherein the processing circuitry is configured to store the data that includes more bits that match the corresponding bits in the search key than the other data in a separate memory device.

8. The apparatus of claim 7, wherein the separate memory device is a static random-access memory (SRAM) memory device.

9. The apparatus of claim 7, wherein the query for the particular data stored in the array of memory cells includes a query for data corresponding to a number of data fields, including:
   a logical block address (LBA) number;
   an LBA offset; and
   a count of bits that do not match corresponding bits in the search key.

10. The apparatus of claim 9, wherein the number of portions of the array of memory cells whose data can be stored in the separate memory device corresponds to an amount of data included in each of the data fields.

11. The apparatus of claim 10, wherein the amount of data included in each of the data fields is defined by the host.

12. An apparatus, comprising:
    an array of memory cells; and
    processing circuitry configured to:
    receive, from a host, a query for data stored in the array of memory cells, wherein the the host sets a maximum mismatch bit count and a minimum mismatch bit count for the query;
    search portions of the array of memory cells for the data;
    determine data stored in the portions of the array of memory cells that includes more bits that match corresponding bits in a search key generated by the host than other data stored in the portions of the array of memory cells; and
    transfer, to the host, only the data that includes more bits that match the corresponding bits in the search key than the other data, wherein the data that includes more bits that match the corresponding bits in the search key than the other data is not transferred to the host when an amount of bits in that data that do not match a corresponding bit in the search key is greater than the maximum mismatch bit count or less than the minimum mismatch bit count.

13. The apparatus of claim 12, wherein the array of memory cells comprises a database.

14. The apparatus of claim 12, wherein the array of memory cells is a three-dimensional (3D) NAND array of memory cells.

15. A system, comprising:
    a host; and
    a memory device coupled to the host, wherein:
    the host is configured to:
    set a maximum mismatch bit count for a query for particular data stored in the memory device and a minimum mismatch bit count for a query for the particular data stored in the memory device;

send, to the memory device, the query for the particular data stored in the memory device; and generate a search key to denote the particular data; and the memory device is configured to, in response to receiving the query:

search portions of the memory device for the particular data;

count a number of bits in each portion of the memory device that do not match the particular data denoted in the search key to determine data stored in the portions of the memory device that includes more bits that match corresponding bits in the query than other data stored in the portions of the memory device; and transfer the data that includes more bits that match the corresponding bits in the search key than the other data to the host, wherein the data that includes more bits that match the corresponding bits in the search key is not transferred to the host when an amount of bits in that data that do not match a corresponding bit in the search key is greater than the maximum mismatch bit count for the query or less than the minimum mismatch bit count for the query.

16. The system of claim 15, wherein the data stored in the portions of the memory device is encrypted.

17. The system of claim 16, wherein the host is configured to decrypt the data stored in the host and the data stored in the memory device.

18. The system of claim 15, wherein the query includes a command to search for the particular data in the memory device.

19. The system of claim 15, wherein the particular data denoted in the search key is encrypted.

20. The system of claim 15, wherein the memory device includes error correction circuitry configured to correct errors in the data that includes more bits that match corresponding bits in the search key than the other data.

21. The system of claim 20, wherein the errors in the data that includes more bits that match corresponding bits in the search key than the other data are corrected before that data is sent to the host.

22. The system of claim 15, wherein the host is configured to determine which portions of the array of memory cells include more bits that match corresponding bits in the search key than other portions of the array of memory cells by comparing the data sent to the host to a search key.

23. A method, comprising:

generating, by a host, a search key denoting particular data;

setting, by the host, a maximum mismatch bit count for a query for the particular data and a minimum mismatch bit count for the query for the particular data;

sending, to a memory device by the host, the query for the particular data; and receiving data that includes more bits that match corresponding bits in the search key than the other data at the host from the memory device or from a buffer coupled to the host, wherein:

the data that includes more bits that match the corresponding bits in the search key than the other data is based at least in part on the results of a search at the memory device that includes a comparison of the search key and determination of mismatched data, relative to the search key, stored within the memory device; and the data that includes more bits that match the corresponding bits in the search key than the other data is not received at the host when an amount of bits in that data that do not match a corresponding bit in the search key is greater than the maximum mismatch bit count for the query or less than the minimum mismatch bit count for the query.

24. The method of claim 23, wherein the particular data is unencrypted.

25. A method, comprising:

receiving, from a host, a query for particular data, wherein the particular data corresponds to a search key generated by the host, and wherein the the host sets a maximum mismatch bit count and a minimum mismatch bit count for the query;

searching, by a memory device, portions of the memory device for the particular data;

counting, by the memory device, a number of bits in each of the portions of the memory device that do not match a corresponding bit in the search key;

identifying data stored in the portions of the memory device that includes more bits that match corresponding bits in the search key than other data stored in the portions of the memory device based at least in part on the counting; and transferring the data that includes more bits that match the corresponding bits in the search key than the other data to the host or to a buffer coupled to the host, wherein the data that includes more bits that match the corresponding bits in the search key than the other data is not transferred to the host when an amount of bits in that data that do not match a corresponding bit in the search key is greater than the maximum mismatch bit count or the less than the minimum mismatch count.

26. The method of claim 25, wherein the portions of the array of memory cells are pages of memory cells.

27. The method of claim 26, further comprising searching an entire page of memory cells in parallel.

\* \* \* \* \*